(12) United States Patent
McGowan et al.

(10) Patent No.: US 10,951,170 B2
(45) Date of Patent: Mar. 16, 2021

(54) APPARATUS AND METHOD FOR ASSISTING ENVELOPE TRACKING WITH TRANSIENT RESPONSE IN SUPPLY VOLTAGE FOR POWER AMPLIFIER

(71) Applicant: QUALCOMM Incorporated, San Diego, CA (US)

(72) Inventors: Michael McGowan, Mesa, AZ (US); Iulian Mirea, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 56 days.

(21) Appl. No.: 16/353,632

(22) Filed: Mar. 14, 2019

(65) Prior Publication Data

US 2020/0052654 A1 Feb. 13, 2020

Related U.S. Application Data

(60) Provisional application No. 62/717,317, filed on Aug. 10, 2018.

(51) Int. Cl.
*H03F 3/04* (2006.01)
*H03F 1/02* (2006.01)
(Continued)

(52) U.S. Cl.
CPC ........... *H03F 1/0255* (2013.01); *H03F 3/213* (2013.01); *H03F 3/45071* (2013.01); *H03F 3/68* (2013.01);
(Continued)

(58) Field of Classification Search
CPC .. H03F 1/0255; H03F 3/213; H03F 2200/267; H03F 2200/396;
(Continued)

(56) References Cited

U.S. PATENT DOCUMENTS 8,508,297 B2 8/2013 Honda et al.
8,975,960 B2 3/2015 Strange et al.
(Continued)

OTHER PUBLICATIONS

International Search Report and Written Opinion—PCT/US2019/042838—ISA/EPO—dated Oct. 11, 2019.

*Primary Examiner* — Khanh V Nguyen
*Assistant Examiner* — Khiem D Nguyen
(74) *Attorney, Agent, or Firm* — Loza & Loza, LLP; Chui-kiu Teresa Wong

(57) ABSTRACT

A power amplifier (PA) circuit includes a circuit for generating a supply voltage at an upper voltage rail for a power amplifier (PA). The circuit includes a DC-to-DC converter for generating a voltage from which the supply voltage is generated; a linear amplifier for sourcing or sinking current to or from the upper voltage rail via a capacitor for performing fine adjustment of the supply voltage; a first switching device coupled between an output of the linear amplifier and a lower voltage rail to selectively assist the linear amplifier sink current through the capacitor to deal with actual or anticipated transient response of the supply voltage; and a second switching device coupled between the upper voltage rail and the lower voltage rail to selectively discharge the capacitor in response to actual or anticipated transient response of the supply voltage.

22 Claims, 4 Drawing Sheets

(51) Int. Cl.
  *H03F 3/213* (2006.01)
  *H03F 3/45* (2006.01)
  *H03F 3/68* (2006.01)

(52) U.S. Cl.
  CPC .. *H03F 2200/102* (2013.01); *H03F 2200/129* (2013.01); *H03F 2200/144* (2013.01); *H03F 2200/267* (2013.01); *H03F 2200/301* (2013.01); *H03F 2200/393* (2013.01); *H03F 2200/396* (2013.01); *H03F 2203/45116* (2013.01); *H03F 2203/45526* (2013.01)

(58) Field of Classification Search
  CPC ......... H03F 2200/102; H03F 2200/393; H03F 2203/45526; H03F 2200/144; H03F 2200/129; H03F 3/45071; H03F 3/68; H03F 2203/45116; H03F 2200/301; H03F 3/45475; H03F 3/195; H03F 3/245; H03F 1/0227
  USPC ........................... 330/136, 297, 127, 277, 51
  See application file for complete search history.

(56) References Cited

U.S. PATENT DOCUMENTS

| | | |
|---|---|---|
| 9,088,247 B2 | 7/2015 | Arno et al. |
| 9,225,289 B2 | 12/2015 | Bar-David et al. |
| 9,252,724 B2 * | 2/2016 | Wimpenny ............. H03F 3/217 |
| 2014/0111178 A1 | 4/2014 | Khlat et al. |
| 2014/0203868 A1 | 7/2014 | Khlat et al. |
| 2014/0218109 A1 | 8/2014 | Wimpenny |
| 2018/0331659 A1 | 11/2018 | Khesbak et al. |

* cited by examiner

US 10,951,170 B2

APPARATUS AND METHOD FOR ASSISTING ENVELOPE TRACKING WITH TRANSIENT RESPONSE IN SUPPLY VOLTAGE FOR POWER AMPLIFIER

CROSS-REFERENCE TO RELATED APPLICATION

This application claims the benefit of the filing date of U.S. Provisional Application, Ser. No. 62/717,317, filed on Aug. 10, 2018, which is incorporated herein by reference.

FIELD

Aspects of the present disclosure relate generally to envelop tracking power amplifiers, and in particular, to an apparatus and method for assisting an envelope tracking circuit with transient response in a supply voltage for a power amplifier (PA) by employing a pair of shunt switching devices for discharging a capacitor and increasing the sinking current through the capacitor, respectively.

BACKGROUND

A power amplifier (PA) is typically employed in a transmitter to amplify an input radio frequency (RF) signal to generate an output RF signal for transmission into free space via an antenna. Many power amplifiers (PAs) are employed in small formfactor devices, such as smart phones. Because such formfactor devices use batteries as their primary power source, it is often desirable to operate power amplifiers (PAs) in a power efficient manner.

To this end, such devices employ power amplifier (PA) circuits that use average power tracking (APT) and envelope tracking (ET) for generating a supply voltage for a power amplifier (PA) such that the operation of the power amplifier (PA) is performed in a power efficient manner. Accordingly, the disclosure relates to improvements in this regard.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

An aspect of the disclosure relates to an apparatus including a load coupled between an upper voltage rail and a lower voltage rail; a capacitor; an amplifier configured to source or sink current to or from the upper voltage rail via the capacitor; and a first switching device coupled between an output of the amplifier and the lower voltage rail, wherein the first switching device is configured to selectively sink current from the upper voltage rail via the capacitor to control a supply voltage on the upper voltage rail.

Another aspect of the disclosure relates to a method including sourcing or sinking current to or from a voltage rail for a load via a first current path including a capacitor to control a supply voltage on the voltage rail; and selectively sinking current from the voltage rail for the load via a second current path including the capacitor to further control the supply voltage on the voltage rail, wherein the second current path is different than the first current path.

Another aspect of the disclosure relates to an apparatus including means for sourcing or sinking current to or from a voltage rail for a load via a first current path including a capacitor; and means for selectively sinking current from the voltage rail for the load via a second current path including the capacitor to further control the supply voltage on the voltage rail, wherein the second current path is different than the first current path.

Another aspect of the disclosure relates to an apparatus including a load coupled between an upper voltage rail and a lower voltage rail; a capacitor; an amplifier configured to source or sink current to or from the upper voltage rail via the capacitor; and a switching device coupled between the upper voltage rail and the lower voltage rail, wherein the switching device is configured to selectively discharge the capacitor.

Another aspect of the disclosure relates to a method including sourcing or sinking current to or from a voltage rail for a load via a first current path including a capacitor to control a supply voltage on the voltage rail; and selectively discharging the capacitor via a second current path different than the first current path.

Another aspect of the disclosure relates to an apparatus including means for sourcing or sinking current to or from a voltage rail for a load via a first current path including a capacitor to control a supply voltage on the voltage rail; and means for selectively discharging the capacitor via a second current path different than the first current path.

To the accomplishment of the foregoing and related ends, the one or more embodiments include the features hereinafter fully described and particularly pointed out in the claims. The following description and the annexed drawings set forth in detail certain illustrative aspects of the one or more embodiments. These aspects are indicative, however, of but a few of the various ways in which the principles of various embodiments may be employed and the description embodiments are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
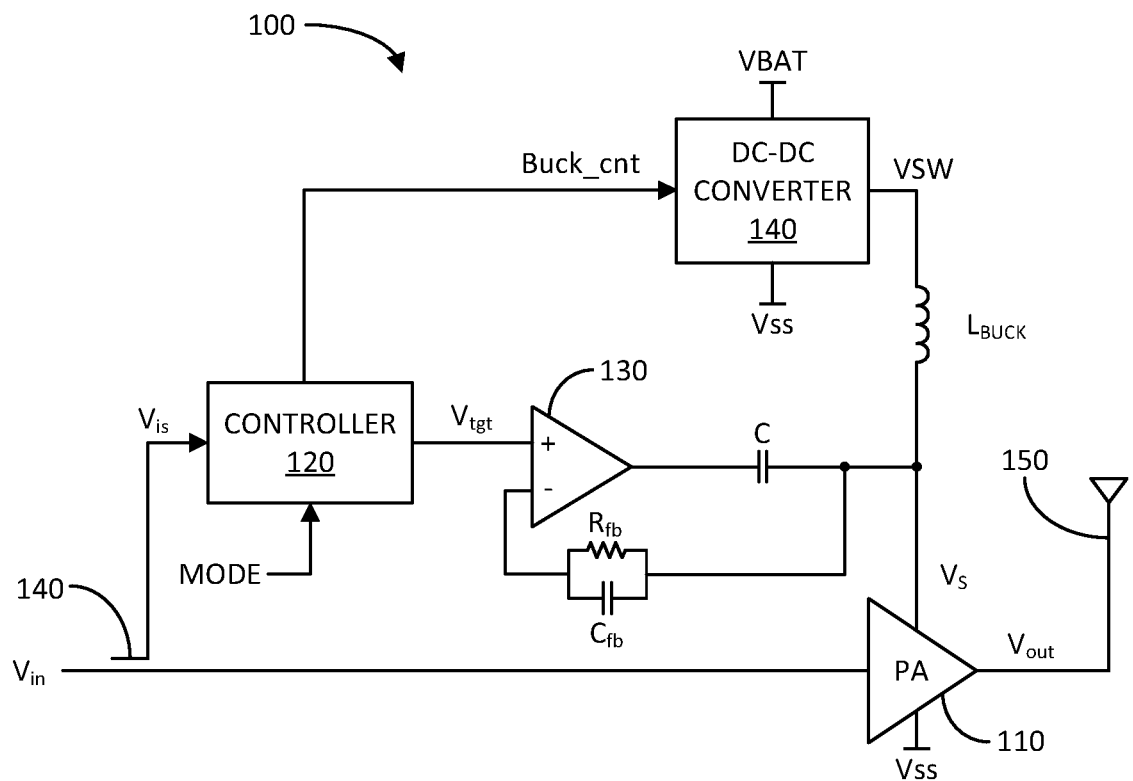
FIG. 1 illustrates a schematic diagram of an exemplary power amplifier (PA) circuit with average power tracking (APT) and envelope tracking (ET) in accordance with an aspect of the disclosure.

FIG. 1 illustrates a schematic diagram of an exemplary power amplifier (PA) circuit 100 with average power tracking (APT) and envelope tracking (ET) in accordance with an aspect of the disclosure. The power amplifier (PA) circuit 100 includes a power amplifier (PA) 110 configured to amplify an input voltage signal $V_{in}$ to generate an output voltage signal $V_{out}$. The power amplifier (PA) circuit 100 further includes an antenna 150 for converting the output voltage signal $V_{out}$ into a wireless signal for transmission into free space.

As discussed, in many applications, it is desirable to operate the power amplifier (PA) 110 in a power efficient manner. This is typically accomplished by providing a variable supply voltage $V_S$ such that the power amplifier (PA) 110 is driven into compression (e.g., to the 1 dB compression point) for at least a portion of the output voltage signal $V_{out}$. As such, the variable supply voltage $V_S$ is varied as a function of the input voltage signal $V_{in}$ to operate the power amplifier (PA) 110 in compression for a significant amount of time to achieve the desired power efficiency.

Two techniques that have gained wide popularity in varying a PA supply voltage for power efficient operation purpose are average power tracking (APT) and envelope tracking (ET). In accordance with the average power tracking (APT), the supply voltage for a power amplifier (PA) is varied as a function of the average voltage or power of the input voltage signal $V_{in}$ over different intervals. In accordance with the envelope tracking (ET), the supply voltage for a power amplifier (PA) is varied in accordance with the envelope of the input voltage signal $V_{in}$. These techniques are discussed further with reference to FIGS. 2A-2B.

Figure 2A:
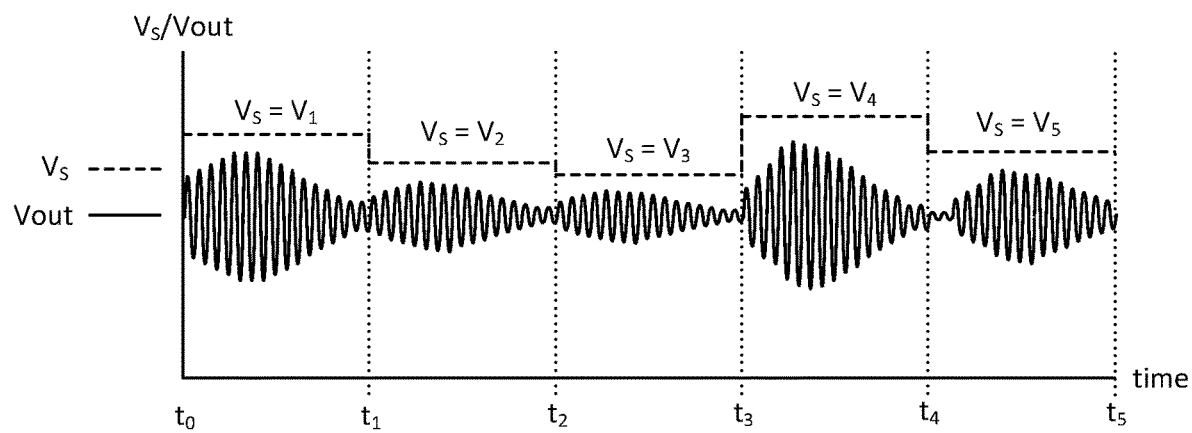
FIG. 2A illustrates a graph of an exemplary supply voltage $V_S$ and output voltage signal $V_{out}$ of a power amplifier (PA) over time when the PA circuit is operating in an average power tracking (APT) mode in accordance with another aspect of the disclosure.

FIG. 2A illustrates a graph of an exemplary supply voltage $V_S$ and output voltage signal $V_{out}$ of the power amplifier (PA) 110 over time when the power amplifier (PA) circuit 100 is operating in average power tracking (APT) mode in accordance with another aspect of the disclosure. The vertical or y-axis of the graph represents the supply voltage $V_S$ indicated as a dashed line and the output voltage signal $V_{out}$ indicated as a solid line. The horizontal or x-axis of the graph represents time.

Thus, as depicted, during time interval $t_0$ to $t_1$, the PA circuit 100 determines the average voltage or power of the input voltage signal $V_{in}$ during such time interval, and generates the supply voltage $V_S$ at a voltage level $V_1$, which is a function or based on the average voltage or power of the input voltage signal $V_{in}$. Similarly, during time interval $t_1$ to $t_2$, the PA circuit 100 determines the average voltage or power of the input voltage signal $V_{in}$ during such time interval, and generates the supply voltage $V_S$ at a voltage level $V_2$ as a function or based on the average voltage or power of the input voltage signal $V_{in}$. Since the average voltage or power of the input voltage signal $V_{in}$ during time interval $t_1$ to $t_2$ is less than the average voltage or power of the input voltage signal $V_{in}$ during time interval $t_0$ to $t_1$, the voltage level $V_2$ is less than the voltage level $V_1$.

Similarly, the PA circuit 100 varies the supply voltage $V_S$ for the power amplifier (PA) 100 in accordance with the average voltage or power of the input voltage signal $V_{in}$ during time intervals $t_2$-$t_3$, $t_3$-$t_4$, and $t_4$-$t_5$ to generate the supply voltage $V_S$ at voltage levels $V_3$, $V_4$, and $V_5$, respectively. As the average voltage or power of the input voltage signal $V_{in}$ during time intervals $t_2$-$t_3$, $t_3$-$t_4$, and $t_4$-$t_5$ decreases, increases, and decreases after time interval $t_1$-$t_2$, the voltage levels $V_3$, $V_4$, and $V_5$ of the supply voltage $V_S$ similarly decreases, increases, and decreases with respect to voltage level $V_2$ (e.g., $V_3<V_2$, $V_4>V_3$, and $V_5<V_4$).

To operate the power amplifier (PA) efficiently in average power tracking (APT) mode, the power amplifier (PA) circuit 100 sets of the voltage level of the supply voltage $V_S$ such that the power amplifier (PA) is somewhat in compression (e.g., at substantially the 1 dB compression point) during the highest peak of the output voltage signal $V_{OUT}$ during each interval. However, with average power tracking (APT), there is some power efficiency reduction when the output voltage signal $V_{out}$ is not at its peak; such as when the output voltage signal $V_{out}$ dips into a valley. Generally, the average power tracking (APT) is more efficient when the output signal $V_{OUT}$ has a relatively low power-to-average power ratio (PAPR) or low crest factor.

Figure 2B:
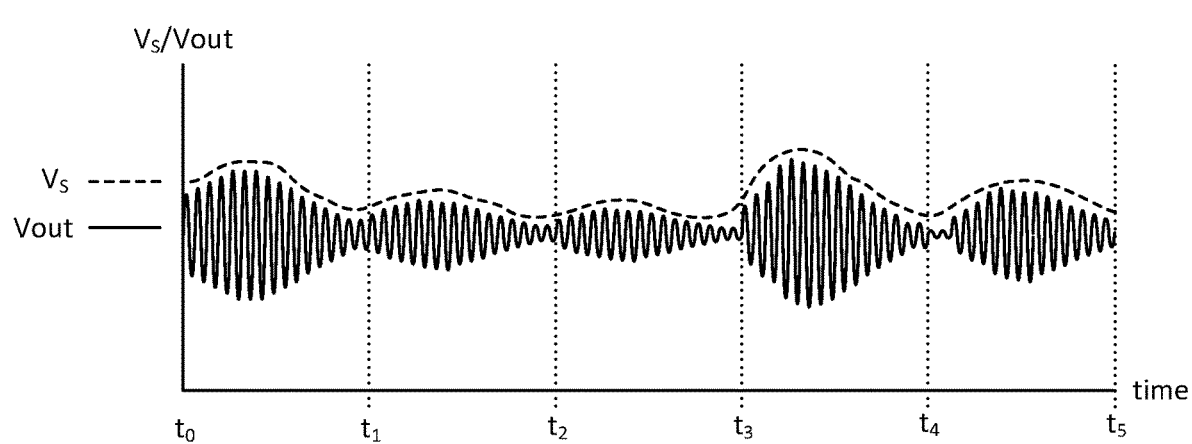
FIG. 2B illustrates a graph of an exemplary supply voltage $V_S$ and output voltage signal $V_{out}$ of a power amplifier (PA) over time when the PA circuit is operating in an envelope tracking (ET) mode in accordance with another aspect of the disclosure.

FIG. 2B illustrates a graph of an exemplary supply voltage $V_S$ and output voltage signal $V_{out}$ of the power amplifier (PA) 110 over time when the PA circuit 100 is operating in envelope tracking (ET) mode in accordance with another aspect of the disclosure. Similarly, the vertical or y-axis of the graph represents the supply voltage $V_S$ indicated as a dashed line and the output voltage signal $V_{out}$ indicated as a solid line. The horizontal or x-axis of the graph represents time.

As depicted, in envelope tracking (ET) mode, the power amplifier (PA) circuit 100 generates the supply voltage $V_S$ for the power amplifier (PA) 110 such that the supply voltage $V_S$ varies with the envelope of the input voltage signal $V_{in}$ or the output voltage signal $V_{out}$. Thus, the power amplifier (PA) circuit 100 attempts to operate the power amplifier (PA) 110 into or close to compression during the entire time the output voltage signal $V_{in}$ is varying. The power amplifier (PA) circuit 100 may limit the amount at which the supply voltage $V_S$ may be decreased during envelope tracking to prevent the power amplifier (PA) 110 from malfunctioning or operating in an unintended manner.

As can be seen, envelope tracking (ET) is a more aggressive technique of operating the power amplifier (PA) 110 in a power efficient manner. Envelope tracking (ET) improves power efficiency more so when the output signal $V_{OUT}$ has a relatively high power-to-average power ratio (PAPR) or crest factor. The application of the average power tracking (APT) and envelope tracking (ET) techniques need not be mutually exclusive. For example, the power amplifier (PA) circuit 100 may employ average power tracking (APT) when the input or output voltage signal $V_{in}$ or $V_{out}$ has a relatively low PAPR or crest factor and/or another condition exists, and employ envelope tracking (ET) when the input or output voltage signal $V_{in}$ or $V_{out}$ has a relatively high PAPR or crest factor and/or yet another condition exists.

Referring again to FIG. 1, for effectuating average power tracking (APT) or envelope tracking (ET), the power amplifier (PA) circuit 100 further includes a controller 120, and an amplifier 130 including an output capacitor C and a feedback network with a feedback resistor $R_{fb}$ coupled in parallel with a feedback capacitor $C_{fb}$. Additionally, the power amplifier (PA) circuit 100 includes a DC-to-DC converter circuit 140, which may be configured as a Buck converter including a Buck inductor $L_{BUCK}$.

A sample $V_{is}$ of the input voltage signal $V_{in}$ is applied to an input of the controller 120 via a directional coupler 140. Additionally, a mode signal is applied to the controller 120; the mode signal indicating whether average power tracking (APT) or envelope tracking (ET) should be employed. Based on the sampled input voltage signal $V_{is}$ and the mode signal, the controller 120 generates a control voltage Buck_cnt for the DC-to-DC converter 140 and a target supply voltage $V_{tgt}$. If the mode signal indicates average power tracking (APT) mode, the linear amplifier 330 may be disabled. In such case, the DC-to-DC converter 140 solely controls the supply voltage $V_S$ for the power amplifier (PA) 310 based on the average power of the input signal Vin.

The DC-to-DC converter 140 is coupled between an upper voltage rail which may receive a battery voltage VBAT and a lower voltage rail Vss (e.g., ground). The DC-to-DC converter 140 generates a voltage VSW based on the control signal Buck_cnt from the controller 120 and the battery voltage VBAT. As an example, the DC-to-DC converter 140 may vary the voltage VSW from 0V to the battery voltage VBAT to an auxiliary voltage VAUX (higher than the battery voltage VBAT), down to the battery voltage VBAT again, and then back to 0V. The process is repeated or altered to achieve a supply voltage $V_S$ for the power amplifier (PA) 110, via current flowing through the Buck inductor $L_{BUCK}$, that substantially tracks the average voltage or power of the input voltage signal $V_{in}$. Most of the power (e.g., direct current (DC) power) supplied to the power amplifier (PA) 110 comes from the DC-to-DC converter 140.

The target supply voltage $V_{tgt}$ from the controller 120 is applied to a positive input of the amplifier 130. The capacitor C couples the output of the amplifier 130 to the voltage rail for the power amplifier (PA) 110. The feedback network ($R_{fb}$ in parallel with $C_{fb}$) is coupled between the voltage rail for the power amplifier (PA) 110 and the negative input of the amplifier 130. The amplifier 130 sources or sinks current (e.g., alternating current (ac)) to and from the voltage rail for the power amplifier (PA) 110 to perform fine adjustment of the supply voltage $V_S$ to achieve the desired average power tracking (APT) or envelope tracking (ET), as discussed. Typically, the linear amplifier 330 control of the supply voltage $V_s$ may be performed on envelope tracking (ET) mode as the linear amplifier 330 has a higher bandwidth than the DC-to-DC converter 340, and is able to control the supply voltage $V_S$ in response to the high frequency changes of the envelope of the input signal $V_{in}$.

In order to perform the fine adjustment of the supply voltage $V_S$ for the power amplifier (PA) 110, the amplifier 130 needs to source or sink the proper amount of current through the capacitor C to regulate the supply voltage $V_S$ as required based on the selected mode. However, when the supply voltage $V_S$ is subject to a large transient response (e.g., the supply voltage $V_S$ increases at a fast rate), the amplifier 130 needs to sink a large amount of current to lower or maintain the supply voltage $V_S$ at the desired level as well as prevent damage to the power amplifier (PA) 110 from excessive supply voltage $V_S$. Often these kinds of transient response in the supply voltage $V_S$ occur when the power amplifier (PA) circuit is changing modes, as explained in more detail below.

Figure 2C:
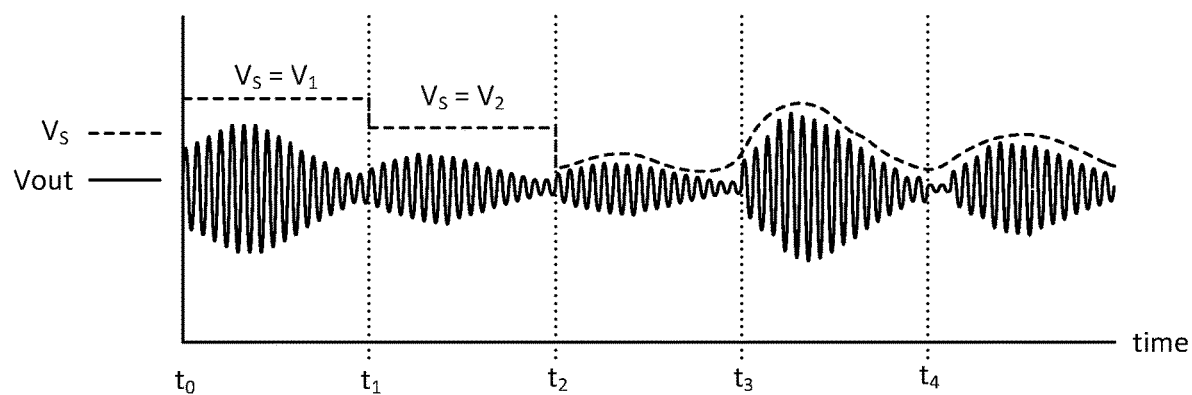
FIG. 2C illustrates a graph of an exemplary supply voltage $V_S$ and output voltage signal $V_{out}$ of a power amplifier (PA) over time when the PA circuit changes its operating mode from average power tracking (APT) to envelope tracking (ET) in accordance with another aspect of the disclosure.

FIG. 2C illustrates a graph of an exemplary supply voltage $V_S$ and output voltage signal $V_{out}$ of the power amplifier (PA) 110 over time when the PA circuit 100 changes its operating mode from average power tracking (APT) to envelope tracking (ET) in accordance with another aspect of the disclosure. Similarly, the vertical or y-axis of the graph represents the supply voltage $V_S$ indicated as a dashed line and the output voltage signal $V_{out}$ indicated as a solid line. The horizontal or x-axis of the graph represents time.

As indicated, during time interval $t_0$-$t_2$, the power amplifier (PA) circuit 100 is operating in average power tracking (APT) mode. Then, at time $t_2$, the power amplifier (PA) circuit 100 changes mode from average power tracking (APT) to envelope tracking (ET). Accordingly, during time interval $t_2$-$t_5$, the power amplifier (PA) circuit 100 is operating in envelope tracking (ET) mode.

During the transition between modes at time $t_2$, the supply voltage $V_S$ has to change or decrease considerably (an example of a transient response) so that the supply voltage $V_S$ is at the appropriate level for envelope tracking (ET). This may require the amplifier 130 to sink substantial current to bring the supply voltage $V_S$ down in a fast manner so that envelop tracking (ET) is effectuated. Additionally, the voltage across the capacitor C may need to be reduced (i.e., the discharging of the capacitor C) in a fast manner in order to maintain the supply voltage $V_S$ at a desired voltage level based on the operation mode or the waveform of the input signal Vin, as well as to keep the supply voltage $V_S$ from spiking up to dangerous level where damage may occur to the power amplifier (PA) 110. The following implementation addresses these concerns.

Figure 3:
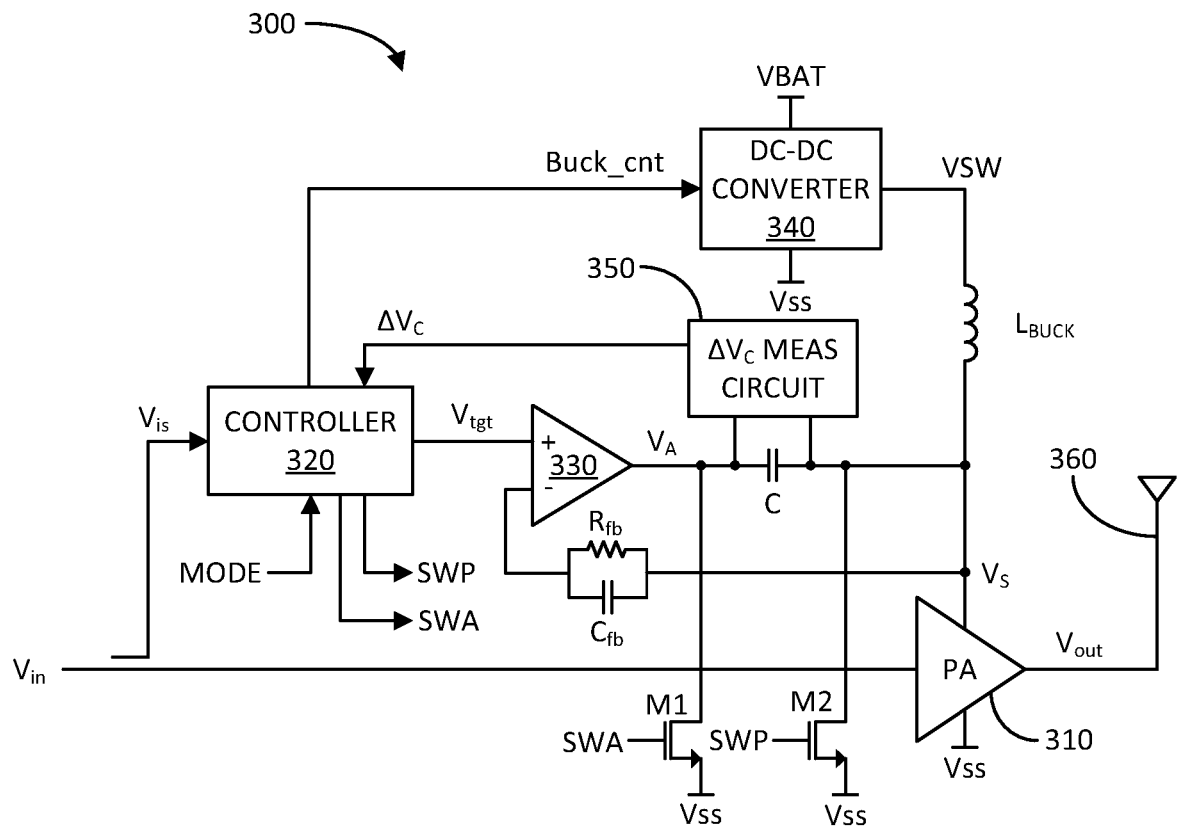
FIG. 3 illustrates a schematic diagram of another exemplary power amplifier (PA) circuit with average power tracking (APT) and envelope tracking (ET) in accordance with another aspect of the disclosure.

FIG. 3 illustrates a schematic diagram of another exemplary power amplifier (PA) circuit 300 with average power tracking (APT) and envelope tracking (ET) in accordance with another aspect of the disclosure.

In summary, the power amplifier (PA) circuit 300 includes a first switching device coupled between the output of the linear amplifier and the lower voltage rail Vss to assist the linear amplifier in sinking current from the voltage rail of the power amplifier (PA). This helps the linear amplifier reduce the supply voltage $V_S$ when needed, for example, in response to an actual or anticipated transient response condition due to a mode change. Additionally, the power amplifier (PA) circuit 300 includes a second switching device coupled between the upper voltage rail for the power amplifier (PA) and the lower voltage rail Vss to discharge the capacitor as needed, such as in response to an actual or anticipated transient response condition due to a mode change or change in an input waveform requiring a small voltage drop across a capacitor C between a linear amplifier and the upper voltage rail for the power amplifier (PA).

In conjunction with the second switching device, the power amplifier (PA) circuit 300 includes a circuit for measuring the voltage across the capacitor. The measured voltage is provided to the controller. The controller turns on the second switching device based on the mode signal, the waveform of the input signal $V_{in}$, and/or the measured voltage across the capacitor to deal with transient response that may be present in the supply voltage $V_S$.

More specifically, the power amplifier (PA) circuit 300 includes a power amplifier (PA) 310, a controller 320, a linear amplifier 330 including an output capacitor C and a feedback network with feedback resistor $R_{fb}$ coupled in parallel with a feedback capacitor $C_{fb}$, a DC-to-DC converter 340 including a Buck inductor $L_{BUCK}$, and an antenna 360. These devices operate similar to the corresponding devices in power amplifier (PA) circuit 100 previously discussed in detail.

To deal with actual or anticipated transient response that may occur in the supply voltage $V_S$, the power amplifier (PA) circuit 300 further includes a first switching device M1 coupled between the output of the linear amplifier 330 and the lower voltage rail Vss. Additionally, the power amplifier (PA) circuit 300 further includes a second switching device M2 coupled between the upper voltage rail for the power amplifier (PA) 310 and the lower voltage rail Vss. The first and second switching devices M1 and M2 may each be configured as an n-channel metal oxide semiconductor field effect transistor (NMOS FET).

Further, the power amplifier (PA) circuit 300 includes a measuring circuit 350 configured to measure the voltage $\Delta V_C$ across the capacitor C. The measured voltage $\Delta V_C$ is provided to the controller 320. The controller 320 generates a control signal SWA, applied to the first switching device M1, to control its on and off state. For example, during non-transient response condition, the controller 320 generates the control signal SWA as a low logic voltage (e.g., Vss) to maintain the first switching device M1 off. During transient response condition, such as when the mode of operation is switched between average power tracking (APT) and envelope tracking (ET) modes, the controller 320 generates the control signal SWA as a high logic voltage (e.g., Vdd) to turn on the first switching device M1 to help the output of the linear amplifier 330 sink current from the upper voltage rail for the power amplifier (PA) 310 so as to reduce the supply voltage $V_S$ quickly to counter the transient response.

Similarly, the controller 320 may monitor the voltage $\Delta V_C$ across the capacitor C via the measuring circuit 350, and generate the control signal SWP based on the voltage $\Delta V_C$ to counter any potentially dangerous or undesirable transient response in the supply voltage $V_S$ or set the supply voltage at the desired level to effectuate envelope tracking. For example, if the controller 320 does not detect the transient response condition or the voltage $\Delta V_C$ across the capacitor C is at an appropriate level based on the current operating condition, the controller 320 generates the control signal SWP as a low logic voltage (e.g., Vss) to maintain the second switching device M2 off. If, on the other hand, the controller 320 determines that the transient response is occurring in the supply voltage $V_S$ or for any reason in which the voltage $\Delta V_C$ across the capacitor C needs to be reduced in a quick manner, the controller 320 generates the control signal as a high logic voltage (e.g., Vdd) to turn on the second switching device M2 to discharge the capacitor C and reduce the voltage $\Delta V_C$ across the capacitor C to a desired level.

However, the controller 320 may not turn on the second switching device M2 if the supply voltage $V_S$ is lower than the output voltage $V_A$ of the linear amplifier 330. In other words, the voltage $\Delta V_C$ across the capacitor C should be equal to or greater than zero (0) as a condition for the controller 320 to turn on the second switching device M2. This condition is summarized below in equation form:

$$\Delta V_C = V_S - V_A, \text{ wherein } \Delta V_C \geq 0$$

Figure 4:
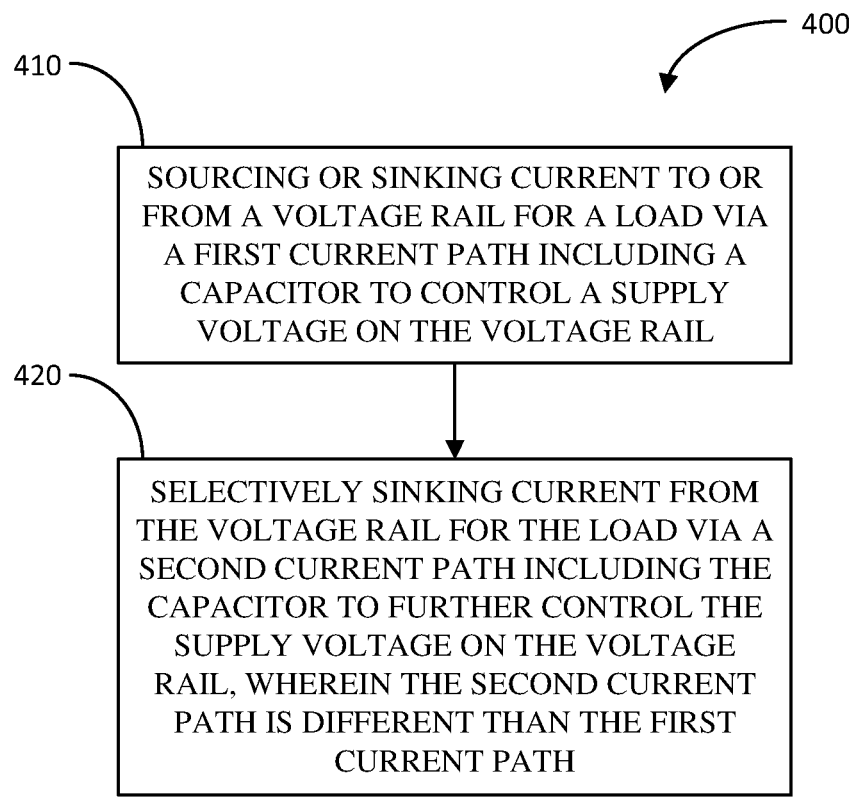
FIG. 4 illustrates a flow diagram of an exemplary method of generating a supply voltage for a power amplifier (PA) in accordance with another aspect of the disclosure.

FIG. 4 illustrates a flow diagram of an exemplary method 400 of generating a supply voltage for a load in accordance with another aspect of the disclosure.

The method 400 includes sourcing or sinking current to or from a voltage rail for a load (e.g., a power amplifier) via a first current path including a capacitor to control a supply voltage on the voltage rail (block 410). An example of means for sourcing or sinking current to or from a voltage rail for a load via a first current path including a capacitor to control a supply voltage on the voltage rail includes the amplifier 330 described herein. The first current path includes the amplifier 330, the capacitor C, and the upper voltage rail for the power amplifier (PA) 310.

The method 400 further includes selectively sinking current from the voltage rail for the load via a second current path including the capacitor to further control the supply voltage on the voltage rail, wherein the second current path is different than the first current path (block 420). An example of means for selectively sinking current from the voltage rail for the load via a second current path including the capacitor to further control the supply voltage on the voltage rail, wherein the second current path is different than the first current path includes switching device M1 described herein. The second current path includes the switching device M1, the capacitor C, and the upper voltage rail for the power amplifier (PA) 310.

Figure 5:
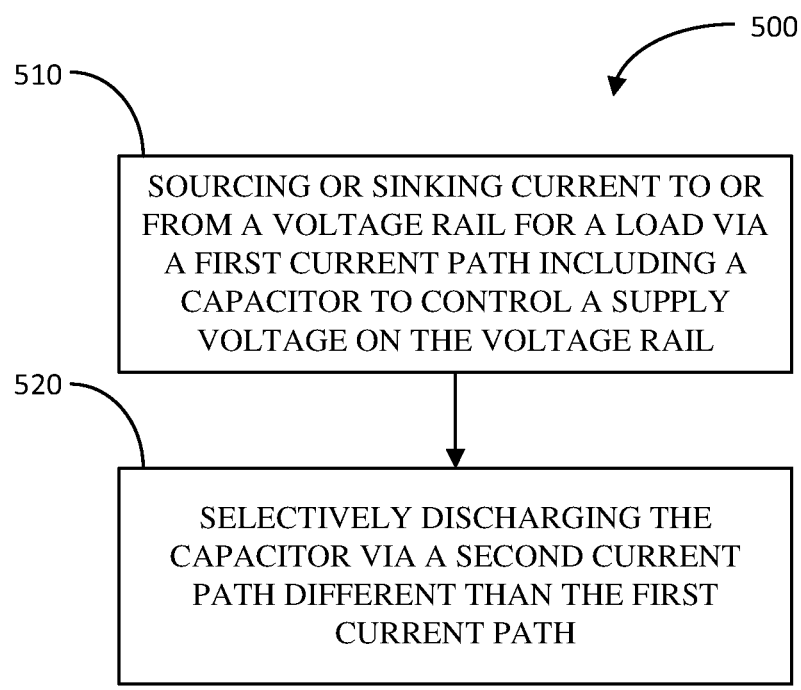
FIG. 5 illustrates a flow diagram of another exemplary method of generating a supply voltage for a power amplifier (PA) in accordance with another aspect of the disclosure.

FIG. 5 illustrates a flow diagram of another exemplary method 500 of generating a supply voltage for a load in accordance with another aspect of the disclosure.

The method 500 includes sourcing or sinking current to or from a voltage rail for a load (e.g., a power amplifier) via a first current path including a capacitor to control a supply voltage on the voltage rail (block 510). An example of means for sourcing or sinking current to or from a voltage rail for a load via a first current path including a capacitor to control a supply voltage on the voltage rail includes amplifier 330 described herein. The first current path includes the amplifier 330, the capacitor C, and the upper voltage rail for the power amplifier (PA) 310.

The method 500 further includes selectively discharging the capacitor via a second current path different than the first current path (block 520). An example of means for selectively discharging the capacitor via a second current path different than the first current path includes switching device M2 described herein. The second current path includes the capacitor C, the second switching device M2, and the lower voltage rail Vss.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed:
1. An apparatus, comprising:
a load coupled between a first voltage rail and a second voltage rail;
a capacitor;
an amplifier configured to source or sink current to or from the first voltage rail via the capacitor;
a first switching device coupled between an output of the amplifier and the second voltage rail, wherein the first switching device is configured to selectively sink current from the first voltage rail via the capacitor to control a supply voltage on the first voltage rail; and a DC-to-DC converter configured to generate a voltage, wherein the supply voltage is based on the voltage from the DC-to-DC converter.

2. The apparatus of claim 1, further comprising a controller configured to turn on the first switching device to sink current from the first voltage rail via the capacitor in response to an event, wherein the event includes a mode change between a first mode where the supply voltage is tracking an average power of an input signal and a second mode where the supply voltage is tracking an envelope of the input signal.

3. The apparatus of claim 2, wherein the load comprises a power amplifier configured to generate an output signal based on the input signal.

4. The apparatus of claim 1, wherein the amplifier is configured to sink current from the first voltage rail via the capacitor at a same time the first switching device is selected to sink current from the first voltage rail via the capacitor.

5. The apparatus of claim 1, wherein the first switching device is configured to be turned off while the amplifier is sourcing current to the first voltage rail via the capacitor.

6. The apparatus of claim 1, wherein the first switching device comprises a field effect transistor (FET).

7. An apparatus, comprising:
a load coupled between a first voltage rail and a second voltage rail;
a capacitor;
an amplifier configured to source or sink current to or from the first voltage rail via the capacitor;
a first switching device coupled between an output of the amplifier and the second voltage rail, wherein the first switching device is configured to selectively sink current from the first voltage rail via the capacitor to control a supply voltage on the first voltage rail; and
a second switching device coupled between the first voltage rail and the second voltage rail, wherein the second switching device is configured to selectively discharge the capacitor.

8. The apparatus of claim 7, further comprising:
a measuring device configured to measure a voltage drop across the capacitor; and
a controller configured to turn on the second switching device based on the voltage drop across the capacitor.

9. The apparatus of claim 7, wherein the second switching device comprises a field effect transistor (FET).

10. The apparatus of claim 7, further comprising a controller configured to turn on the second switching device based on an input signal or a change between a first mode of controlling the supply voltage based on an average power of the input signal and a second mode of controlling the supply voltage based on an envelope of the input signal.

11. The apparatus of claim 1, further comprising an inductor coupled between the DC-to-DC converter and the first voltage rail for the load.

12. A method, comprising:
sourcing or sinking current to or from a first voltage rail for a load via a first current path including a capacitor to control a supply voltage on the first voltage rail; and
selectively sinking current from the first voltage rail for the load via a second current path including the capacitor to further control the supply voltage on the first voltage rail, wherein the second current path is different than the first current path, wherein the load comprises a power amplifier, wherein sourcing or sinking current to or from the first voltage rail is based on an input signal to the power amplifier, and wherein selectively sinking current from the first voltage rail for the load via the second current path is in response to a mode change between a first mode where sourcing or sinking current to or from the first voltage rail is based on an average power of the input signal and a second mode where sourcing or sinking current to or from the first voltage rail is based on an envelope of the input signal.

13. The method of claim 12, wherein the first current path comprises an amplifier, the capacitor, and the first voltage rail.

14. The method of claim 13, wherein the second current path comprises the first voltage rail, the capacitor, a switching device, and a second voltage rail.

15. The method of claim 12, wherein sourcing or sinking current to or from the first voltage rail is based on an average power of the input signal.

16. The method of claim 12, wherein sourcing or sinking current to or from the first voltage rail is based on an envelope of the input signal.

17. The method of claim 12, further comprising selectively discharging the capacitor.

18. A method, comprising:
sourcing or sinking current to or from a first voltage rail for a load via a first current path including a capacitor to control a supply voltage on the first voltage rail;
selectively sinking current from the first voltage rail for the load via a second current path including the capacitor to further control the supply voltage on the first voltage rail, wherein the second current path is different than the first current path; and
selectively discharging the capacitor, wherein selectively discharging the capacitor is via a third current path.

19. The method of claim 18, wherein the third current path comprises the capacitor, a switching device, and a second voltage rail.

20. The method of claim 12, wherein the load comprises a power amplifier, and wherein selectively discharging the capacitor is in response to an input signal to a power amplifier or a mode change between a first mode where sourcing or sinking current to or from the first voltage rail is based on an average power of the input signal and a second mode where sourcing or sinking current to or from the first voltage rail is based on an envelope of the input signal.

21. An apparatus, comprising:
a load coupled between a first voltage rail and a second voltage rail;
a capacitor;
an amplifier configured to source or sink current to or from the first voltage rail via the capacitor;
a switching device coupled between the first voltage rail and the second voltage rail, wherein the switching device is configured to selectively discharge the capacitor;
a measuring device configured to measure a voltage drop across the capacitor; and
a controller configured to turn on the switching device based on the voltage drop across the capacitor.

22. An apparatus, comprising:
a load coupled between a first voltage rail and a second voltage rail;
a capacitor;
an amplifier configured to source or sink current to or from the first voltage rail via the capacitor;
a switching device coupled between the first voltage rail and the second voltage rail, wherein the switching device is configured to selectively discharge the capacitor; and a controller configured to turn on the switching device based on an input signal or a mode change between a first mode of controlling the supply voltage based on an average power of the input signal and a second mode of controlling the supply voltage based on an envelope of the input signal.

\* \* \* \* \*